United States Patent [19]
Mehta et al.

[11] Patent Number: 6,071,784
[45] Date of Patent: *Jun. 6, 2000

[54] ANNEALING OF SILICON OXYNITRIDE AND SILICON NITRIDE FILMS TO ELIMINATE HIGH TEMPERATURE CHARGE LOSS

[75] Inventors: Sunil D. Mehta, San Jose; Radu Barsan, Saratoga, both of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/921,003

[22] Filed: Aug. 29, 1997

[51] Int. Cl.$^7$ .................................................. H01L 21/336
[52] U.S. Cl. ........................... 438/303; 438/305; 438/643
[58] Field of Search ...................... 438/303, 305

[56] References Cited

U.S. PATENT DOCUMENTS

| | | |
|---|---|---|
| 4,866,009 | 9/1989 | Matsuda . |
| 5,057,897 | 10/1991 | Nariani et al. . |
| 5,065,222 | 11/1991 | Ishii . |
| 5,128,279 | 7/1992 | Nariani et al. . |
| 5,229,311 | 7/1993 | Lai et al. . |
| 5,291,058 | 3/1994 | Samata et al. . |
| 5,323,047 | 6/1994 | Nguyen . |
| 5,595,928 | 1/1997 | Lu et al. . |
| 5,825,068 | 10/1998 | Yang . |

FOREIGN PATENT DOCUMENTS

| | | |
|---|---|---|
| 5-343541 | 12/1993 | Japan . |
| 406163522 | 6/1994 | Japan . |

OTHER PUBLICATIONS

Ghandhi, S. K., VLSI Fabrication Principles, Silicon and Gallium Arsenide, Second Edition, pp. 530–535, 728–730, 1994.
Wolf, S., Silicon Processing for the VLSI Era, vol. 1—Process Technology, pp. 57, 58, 113–114 and 193–194, 1986.
Yoshida, S., Improvement of Endurance to Hot Carrier Degradation by Hydrogen Blocking P–SiO, IEEE, IEDM, pp. 22–25, Dec. 11, 1988.

*Primary Examiner*—John F. Niebling
*Assistant Examiner*—Jonathan Hack
*Attorney, Agent, or Firm*—Fliesler, Dubb, Meyer & Lovejoy

[57] ABSTRACT

This invention includes a semiconductor device having a gate formed on a semiconductor substrate with a low hydrogen content etch stop or barrier layer formed over the gate, and methods for manufacturing a semiconductor device with an etch stop or barrier layer with low free hydrogen content. The semiconductor device may have a hydrogen getter layer formed between the gate and the etch stop or barrier layer. The etch stop or barrier layer is a high temperature PECVD nitride film, a high temperature PECVD oxynitride film or a high temperature LPCVD nitride film. The hydrogen getter layer is P-doped film having a thickness between about 500 Å and about 2000 Å and is a PSG, BPSG, PTEOS deposited oxide film, or a BPTEOS deposited oxide film. The low free hydrogen content of the etch stop layer or barrier layer is achieved by a high temperature annealing step, performed at a higher temperature than the deposition temperature of the etch stop or barrier layer. Specific uses of the etch stop or barrier layers include manufacture of electrical contacts and local interconnects.

31 Claims, 6 Drawing Sheets

ANNEALING OF SILICON OXYNITRIDE AND SILICON NITRIDE FILMS TO ELIMINATE HIGH TEMPERATURE CHARGE LOSS

RELATED CASE

Semiconductor devices with tungsten damascene local interconnects having a hydrogen getter layer and a low hydrogen content LI etch stop layer. Inventors: Sunil Mehta, Radu Barsan, Xiao-Yu Li. This case is herein incorporated fully by reference.

FIELD OF THE INVENTION

This invention relates generally to semiconductor devices with plasma nitride or plasma oxynitride films, and more specifically, to high performance semiconductor devices with plasma nitride or plasma oxynitride films.

BACKGROUND OF THE INVENTION

Future development in the semiconductor industry focuses on increasing the speed of and decreasing the size of integrated circuits. The requirements for speed and miniaturization are met by increasing the density of elements in those integrated circuits. These two requirements have thus become major goals in designing and manufacturing efforts concerned with MOSFETs and other semiconductor devices, including both volatile and non-volatile memory devices.

MOSFETs are metal-on-silicon field effect transistors composed of source and drain regions separated by a gate consisting of gate oxide overlaid with gate metal. Application of a voltage to the gate metal causes the formation of an electrical field underneath the gate metal which forms an electrically conductive channel in the semiconductor material underneath the gate, permitting the flow of current through the channel from the source to the drain region.

Increasing the density of elements in integrated circuits means that smaller channel lengths and widths must be used. As the dimensions of semiconductor devices decreases, the existing "long-channel" performance models for MOSFET devices predicted that a decrease in the channel length, L, or in the gate oxide thickness $T_{ox}$, would increase the saturation current, $I_{DSAT}$. However, as MOSFET devices were scaled below approximately 2 $\mu$m, effects not predicted by the long channel models were observed and were thereafter termed "short-channel" effects.

As device dimensions of MOSFETs continued to decrease, it became apparent that problems associated with the short-channel effects could be placed in two general categories: (1) the problem of increased leakage current when the MOSFET is off, and (2) reliability problems associated with short-channel and thin gate oxide device structures.

Some of the reliability problems that arise in short-channel and thin gate oxide MOSFETs include: (1) thin gate oxide breakdown, (2) device degradation due to hot-carrier effects, and (3) reliability problems associated with interconnects between MOSFETS. One of the major problems associated with semiconductor devices other than MOSFETs involves high-temperature data retention in nonvolatile memory cells. The two problems that are of particular interest are device degradation due to hot-carrier effects and high temperature data retention problems in nonvolatile memory cells.

The characteristics of the Si—$SiO_2$ interface determine to a great extent, the functioning of the gate dielectric. A study of the structure of the interface has resulted in the development of the concept of "surface states" and interface trapped charge, which affect the threshold voltage of MOSFET devices.

The term "surface states" refers to electronic energy states that arise in a crystal if the crystal lattice is terminated at a surface such as that existing at the Si—$SiO_2$ interface. A theory which may account for surface states is the postulated existence of "dangling bonds." Dangling bonds are locations at which atoms do not have adjacent atoms to share available bonds. These surface states are confined to the region adjacent to the surface or to the interface. According to this theory, each of the surface states is associated with a single atom at the surface or the interface, and therefore, an electron occupying one of the surface states is considered to be localized because the electron is forced to remain in a restricted region of space centered around the atom. Because such surface states effectively trap free carriers at the surface or at the interface, they are also called "interface traps." Although the electrical behavior of the interface traps can be predicted, the physical origin of the surface states is not known exactly.

In an ideal Si—$SiO_2$ interface, all of the Si bonds at the interface can be used for the formation of $SiO_2$. However, this ideal state is never attained in reality, and if only a small number of these Si bonds are not used for forming $SiO_2$, a significant number of surface states can exist. This is because, on a silicon surface, there are as many as $6.8 \times 10^{14}$ Si atoms per $cm^2$. If, for example, there are 1/1000 of these bonds left dangling, the density of charges trapped at the interface is approximately $6.8 \times 10^{11}/cm^2$. With a gate oxide thickness of 20 nanometers (nm), this number of dangling bonds can cause a threshold voltage to shift by approximately 0.63 volts. This example indicates that if the dangling bond theory is correct, a relatively small number of residual dangling bonds can significantly perturb the device characteristics. These dangling bonds can be created by injection of energetic carriers, also called hot carriers, into the gate oxide.

The hot-carrier effects are of increasing importance when MOSFETS are scaled into the submicron range. The hot carrier effects are increased when the MOSFET device dimensions are reduced and the supply voltage remains constant or is not reduced in proportion to the reduction in the device dimensions. As a result of increased current density, the lateral electric field density in the channel increases, which causes the inversion-layer charges to be accelerated (or heated) to an extent that they cause a number of harmful device phenomena. The most important of these hot-carrier effects is the damage inflicted to the gate oxide and the Si—$SiO_2$ interface. This leads to a time-dependent degradation of various MOSFET characteristics, including increased threshold voltage, decreased linear region transconductance, and decreased saturation current.

Thus, the lifetimes of conventional MOSFET structures subjected to such degradation may be reduced below the generally accepted benchmark of 10 years. This degradation has been observed in NMOS devices with channel lengths smaller than 1.5 $\mu$m, and in PMOS devices with submicron channel lengths. Because of the hot-carrier effects, it is imperative to develop techniques to counteract this problem.

One of the approaches to reducing hot-carrier effects is to attempt to hydrogenate dangling bonds by annealing in hydrogen environment at approximately 400° C. This is normally the last step prior to assembly and packaging of integrated circuits. This hydrogen annealing step is done to permit hydrogen to penetrate into the gate oxide and bond with the Si—SiO$_2$ at the interface, thus forming Si—OH bonds.

However, the Si—H or Si—OH bonds can be easily broken by electrons injected as a result of hot-carrier phenomena, giving rise to free hydrogen ions, which diffuse throughout the interface and cause increased bond-breaking behavior rather than enhancing the stability of the dangling bonds.

Moreover, there are problems with high-temperature data retention in nonvolatile memory cell arrays such as EPROMs, FLASH EPROMs, and E$^2$PROMs. This poor high-temperature data retention may be due to mobile hydrogen atoms that diffuse to the floating gate in a non-volatile memory cell and cause the charge on the floating gate to be lost.

One measure of date retention is the charge loss ($\Delta$VTE) measured after baking the devices at 250° C. for 24 hours. The typical standard for the maximum acceptable charge loss is 0.1 V over 24 hours.

The reduced memory cell size and high-performance logic circuits has necessitated the use of a borderless local interconnect structure and trench isolation. The prior art developed a low-temperature, damascene-tungsten local interconnect for a 0.25 $\mu$m channel CMOS technology with trench isolation. Once such prior art structure is described in "A Low-Temperature Local Interconnect Process in a 0.25 $\mu$m-channel CMOS Logic Technology with Shallow Trench Isolation" by J. Givens et al, VMIC Conference 103:43–48 (1994). Other applications of nitride and oxynitride layers are as barrier or etch stop layers, even when local interconnects are not present.

However, the prior art includes the use of silicon nitride films that have high hydrogen content as etch stop layers. The high hydrogen content causes problems discussed in the article "Effects of Silicon Nitride Encapsulation on MOS Device Stability" by R. C. Sun et al, IEEE 80:244–251 (1980). This article describes a new threshold instability phenomenon observed in MOS transistors encapsulated with plasma deposited silicon nitride films and describes a series of experiments which indicated that the instability was due to a chemical effect associated with hydrogen in the silicon nitride film. The article postulated that the formation of surface states and fixed charges in the channel region was due to the interaction of hot carriers with hydrogen present at the interface and was the basic mechanism causing the instability.

One attempted solution to this problem is the use of low pressure (LP) CVD to deposit etch stop layers. The temperature of this process can be high, in the range of 800° C. Although this high temperature removes free hydrogen from the nitride layers, LPCVD places large stresses on the film layer, making it susceptible to cracking.

Therefore, what is needed are low residual stress semiconductor devices that have low amounts of free hydrogen and methods of manufacturing such low residual stress, low hydrogen content semiconductor devices.

SUMMARY OF THE INVENTION

Thus, one object of the present invention is the development of semiconductor devices containing low amounts of free hydrogen.

An additional object of the invention is the development of methods to reduce the amount of free hydrogen in semiconductor devices.

Thus, the invention is directed to the methods of manufacture of semiconductor devices containing the low amounts of free hydrogen and to devices with low free hydrogen.

One aspect of the invention is a semiconductor device with an etch stop or barrier layer formed on a semiconductor device wherein the etch stop or barrier layer is a high temperature PECVD silicon nitride film, and wherein the device is subjected to a high-temperature annealing step to remove residual hydrogen from the device.

Another aspect of the invention is a semiconductor device with an etch stop or barrier layer formed on a semiconductor device wherein the local interconnect etch stop layer is a high temperature PECVD silicon oxynitride film, wherein the device is subjected to a high-temperature annealing step to remove residual hydrogen from the device.

Yet another aspect of the invention is a semiconductor device with an etch stop or barrier layer formed on a semiconductor device wherein the etch stop or barrier layer is a high temperature low pressure (LP) CVD nitride film, wherein the device is subjected to a high-temperature annealing step to remove residual hydrogen from the device.

Yet another aspect of the invention is the use of nitride and/or oxynitride layers are as an etch stop or barrier layer, even when local interconnects are not present.

An additional aspect of the invention is a method for removing free hydrogen from a semiconductor device by using a high-temperature annealing step after the deposition of an etch stop or barrier layer.

The present invention is better understood upon consideration of the detailed description below, in conjunction with the accompanying drawings. As will become apparent to those skilled in the art from this description, the embodiments contained herein of this invention are simply by way of illustration, and are not limiting to the scope of the invention. Other embodiments are possible which are within the scope of the invention.

Additionally, there may be other theories which may account for the observations and problems solved by the present invention. Thus, the invention is not dependent upon any particular theory.

DETAILED DESCRIPTION

The present invention solves the problems described above by providing a method for removing free hydrogen from semiconductor devices. A high temperature CVD process is used to deposit the etch stop or barrier layer. Plasma enhanced (PE) CVD process using silicon nitride, or silicon oxynitride may be used. The temperature of this CVD process is about 480° C.

To remove free hydrogen from an etch stop layer, the device is heated in a substantial vacuum to a temperature above about 500° C., preferably in the range of about 725° C. to about 775° C., and most preferably at approximately 750° C. For furnace heating, a duration of about 1 h is suitable, and for rapid thermal processing (RTP) only about 1 minute is needed. The exact times required can be determined for each type of heater and for the specific conditions of use. Such determinations are within the abilities of workers of ordinary skill in the art, and do not require undue experimentation.

This approach is not obvious in light of the prior art, which introduces hydrogen into the etch stop or barrier layers during both the deposition of the etch stop or barrier layers, and during the annealing step to reduce the number of dangling bonds.

The etch stop or barrier layers of this invention can be up to 2000 Å in thickness. For applications in which the end result is protection of silicide, the thickness of the etch stop layer should be about 350 Å, and for FGP applications, a thickness of about 1000 Å is desired. The thickness can be optimized to suit the particular needs of the manufacturer.

This process is useful for any application in which the affected device can withstand the high temperatures required. For example, tungsten-damascene, spin-on glass (SOG) and other uses involving low dielectric constant materials and a nitride or oxynitride layer can be improved using the high temperature annealing process of this invention.

Figure 1:
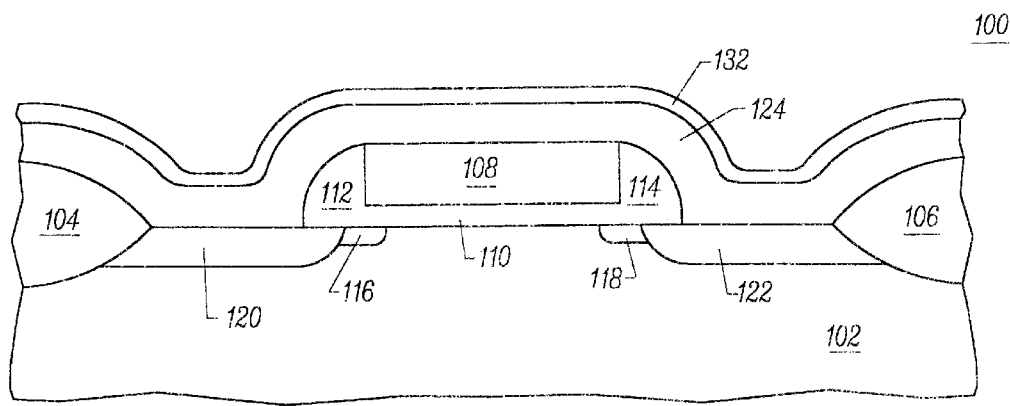
FIG. 1 is a depiction of a non-volatile memory cell which has a floating gate, a floating gate protect layer and is covered by an etch stop or barrier layer.

One embodiment of this invention is shown in FIG. 1. A semiconductor device 100 is manufactured on a semiconductor substrate 102 with the field oxide regions 104 and 106. The field oxide regions 104 and 106 regions are formed by locally oxidizing silicon (LOCOS) methods known in the art and will not be discussed further. Alternatively, electrical isolation can also be achieved by forming shallow trench isolation regions. The semiconductor device 100 has a floating gate 108, typically a polysilicon gate, separated from the semiconductor substrate by a gate oxide layer 110 with the sidewall spacers 112 and 114 formed on each side of the floating gate 108. The lightly doped drain (LDD) regions 116 and 118 are formed in the semiconductor substrate 102. The LDD regions 116 and 118 are typically formed by masking regions of the device 100 and implanting selected ions into the substrate 102. The formation of the LDD regions is typically done before the formation of the sidewall spacers 112 and 114. Ions that can be used to form LDD regions are phosphorous ions at a concentration of about $10^{13}$ ions per $cm^2$. The methods of implanting ions are well know in the semiconductor manufacturing art and will not be discussed further.

The floating gate is overlain with a floating gate protect (FGP) 124, conventionally being an un-doped oxide layer, but in this invention, the FGP layer is chosen to be a hydrogen getter layer. The purpose of the "getter layer" 124 is to trap free hydrogen ions which are released during use of the semiconductor device, and to protect underlying areas from forming silicide layers in subsequent processing steps. The hydrogen getter layer 124 is a film such as a phosphosilicate glass (PSG) film, a borophosphosilicate glass (BPSG) film, a phosphorus-doped tetraethylorthosilicate (PTEOS) deposited oxide film, or a borophosphorus-doped tetraethylorthosilicate (BPTEOS) deposited oxide film. The hydrogen getter layer 124 has a thickness of between 500 Å and 2000 Å. The portion of the device 100 is only one portion of the entire device, and the hydrogen getter layer 124 is formed over the surface of the entire device. The hydrogen getter layer 124 is removed in those areas where silicide layers are to be formed. The hydrogen getter layer 124 is not removed from those areas where silicide formation is not desired. When a hydrogen getter layer is combined with the high temperature anneal of this invention, the reliability and high temperature stability of the resulting devices is maximized. After deposition of the hydrogen getter layer 124, an etch stop or barrier layer 132 is deposited. This layer could be a barrier layer for conventional contacts described below in FIGS. 2–4, or could be an etch stop layer for local interconnect as described below in FIGS. 5–7.

After deposition of the etch stop or barrier layer 132, the device is subjected to the high temperature anneal step. The wafers may be batch heated in a conventional furnace type heater for periods of about 1 hour at temperatures above about 500° C., preferably in the range of about 725° C. to about 775° C., an most preferably at about 750° C. Alternatively, a cluster tool comprising a rapid thermal processing (RTP) station may be used to anneal the wafer. In this embodiment, the duration of exposure to the RTP process may be about 1 minute.

Figure 2:
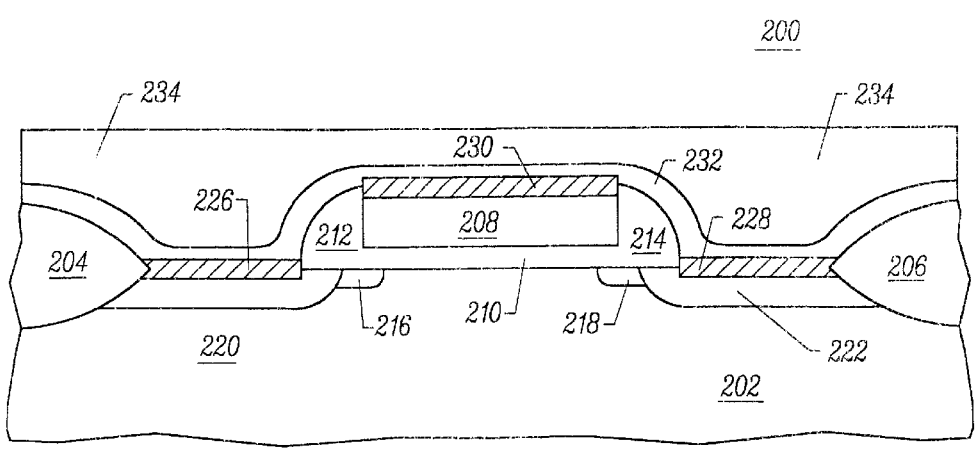
FIG. 2 is a depiction of a semiconductor device manufactured in accordance with this invention, having an etch stop or barrier layer before the manufacture of an electrical connection.

Another embodiment of this invention is shown in FIG. 2. A non-volatile memory cell 200 is manufactured on a semiconductor substrate 202 with the field oxide regions 204 and 206. The field oxide regions 204 and 206 regions (LOCOS) are manufactured using methods known in the art and will not be described further. Alternatively, electrical isolation can also be achieved by forming shallow trench isolation regions. The semiconductor device 200 has a gate 208, typically a polysilicon gate, separated from the semiconductor substrate by a gate oxide layer 210 with the sidewall spacers 212 and 214 formed on each side of the floating gate 208. The lightly doped drain (LDD) regions 216 and 218 are formed in the semiconductor substrate 202. The LDD regions 216 and 218 are typically formed by masking regions of the device 200 and implanting selected ions into the substrate 202. The formation of the LDD regions is typically done before the formation of the sidewall spacers 212 and 214. Ions that can be used to form LDD regions are phosphorous ions at a concentration of about $10^{13}$ ions per $cm^2$. The methods of implanting ions are well know in the semiconductor manufacturing art and will not be discussed further.

A source region 220 and a drain region 222 are thereafter formed in the semiconductor substrate 202. The formation of these regions is typically done by ion implantation of appropriate ions and the methods are well known in the semiconductor manufacturing art and will not be discussed further. The concentration of ions in the source and drain regions 220 and 222 is greater than the concentration of the ions in the LDD regions 216 and 218, and thus, the functions of the LDD regions 216 and 218 are subsumed by the source and drain regions 220 and 222. Ions that are typically implanted into the source and drain regions 216 and 218 are arsenic ions at a concentration of about $10^{15}$ ions per $cm^2$. It should be appreciated that other ions can be used to form either the LDD regions or the source and drain regions.

A source silicide layer 226 is formed on the source region 220, a drain silicide layer 228 is formed on the drain region 222, and a gate silicide layer is formed on the gate 230. Silicide layers are typically titanium silicide, $TiSi_2$, or cobalt silicide, $CoSi_2$, and are formed by methods well known in the semiconductor manufacturing art and will not be discussed further.

A barrier or etch stop layer 232 is formed on the entire semiconductor device 200. The barrier or etch stop layer 232 is formed by a high temperature (480° C. or higher) plasma CVD process which deposits a film of silicon nitride or silicon oxynitride or, alternatively, by an LPCVD process which deposits a silicon nitride film. The barrier or etch stop layer 232 is used to protect underlying features of the semiconductor device 200 from the typical etch materials used to etch silicon dioxide.

After deposition of the barrier or etch stop layer 232, the device is then exposed to the high temperature anneal process of this invention.

After annealing, the device 200 is coated with a dielectric material 234 formed on the semiconductor device 200. The dielectric material 234 electrically insulates the underlying portions of the device 200 from other elements that may be manufactured above the dielectric layer 234. It is important that the high temperature annealing process be carried out before a cap layer of $SiO_2$ dielectric is deposited on the device. A cap layer effectively traps free hydrogen, preventing its escape during subsequent processing steps. Therefore, for each layer of device structure, a separate anneal step must be performed to take advantage of decreasing the free hydrogen of the etch stop or barrier layer. The dielectric layer is planarized using chemical mechanical planarization, typically done by chemical mechanical polishing (CMP).

Figure 3:
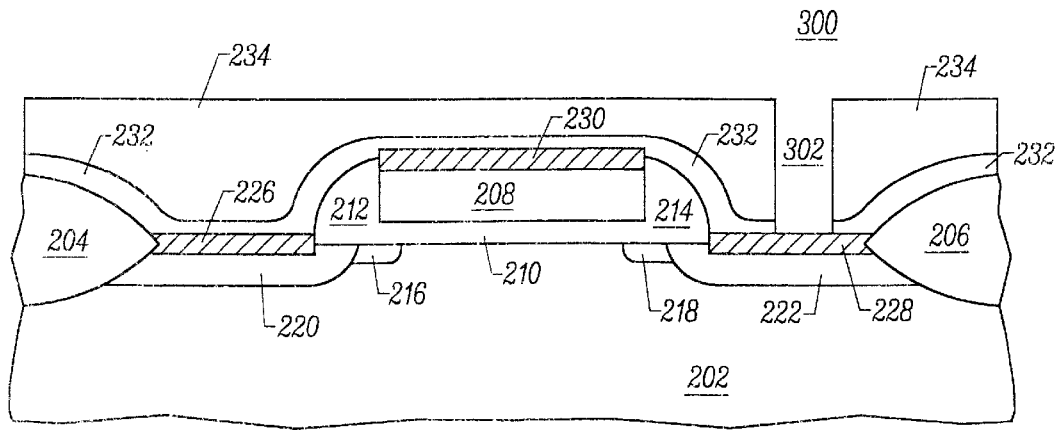
FIG. 3 is a depiction of the semiconductor device of FIG. 2 wherein an area of photoresist has been removed to expose underlying structures prior to manufacture of an electrical connection.
Figure 4:
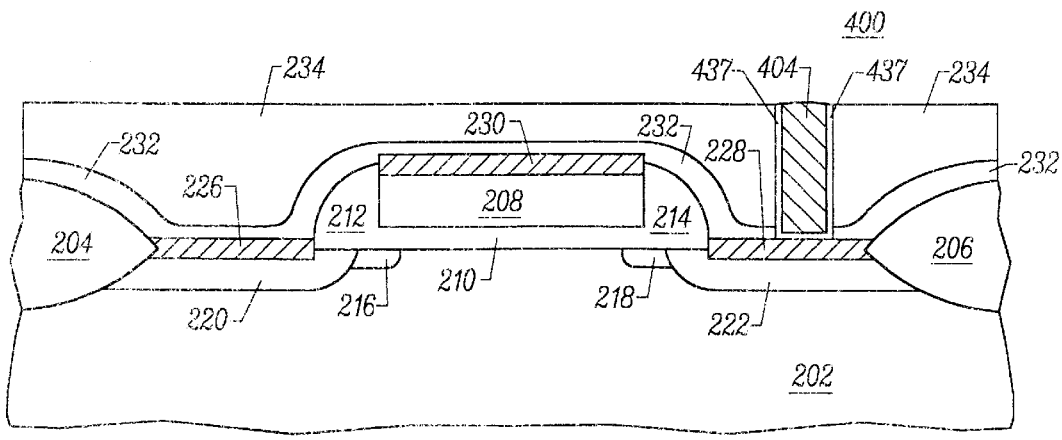
FIG. 4 is a depiction of the semiconductor device of FIGS. 2 and 3, wherein an electrical connection has been manufactured.

FIGS. 3 and 4 show the formation of an electrical contact by subsequent processing of the semiconductor device 300. Like numerical designations are used in FIGS. 3 and 4 for like elements as shown in FIG. 2. In FIG. 3, after depositing the dielectric 234, the wafer is etched to create a channel 302 through the dielectric 234, exposing the drain silicide layer 228. The channel 302 allows electrical contact between selected portions of the underlying device 228 and selected portions of any device manufactured above the dielectric layer of the device 300.

FIG. 4 shows the subsequent formation of a conventional contact. An adhesive layer 437 is deposited in the channel 302. The adhesive layer 437 is made of Ti, TiN, or any other adhesive material known in the art. Subsequently, a tungsten plug 404 is then deposited using conventional CVD approaches to make an electrical connection with the drain silicide layer 228, other portions of the same layer of the device 300, or any other device manufactured above the dielectric layer 234. After tungsten deposition, the surface of the wafer is polished using conventional methods, resulting in a tungsten plug 404 contact.

Figure 5:
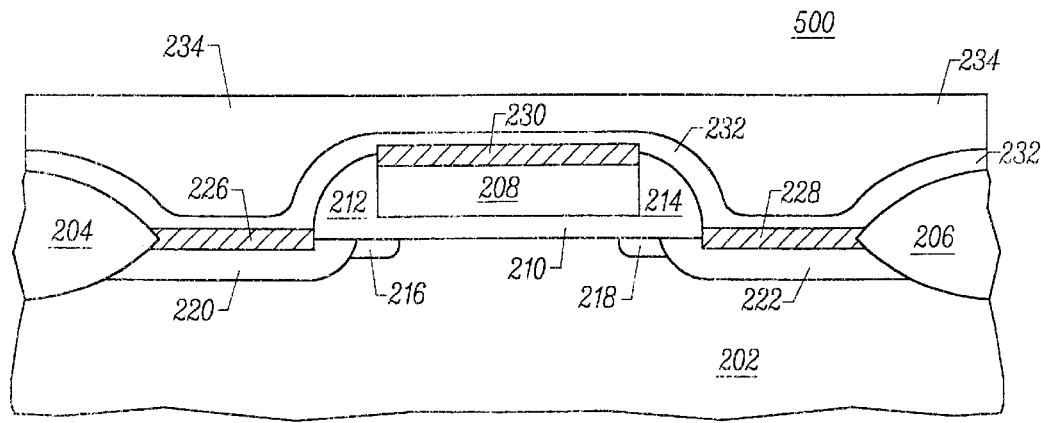
FIG. 5 is a depiction of a semiconductor device having an etch stop or barrier layer manufactured according to this invention, before creation of a local interconnect.
Figure 6:
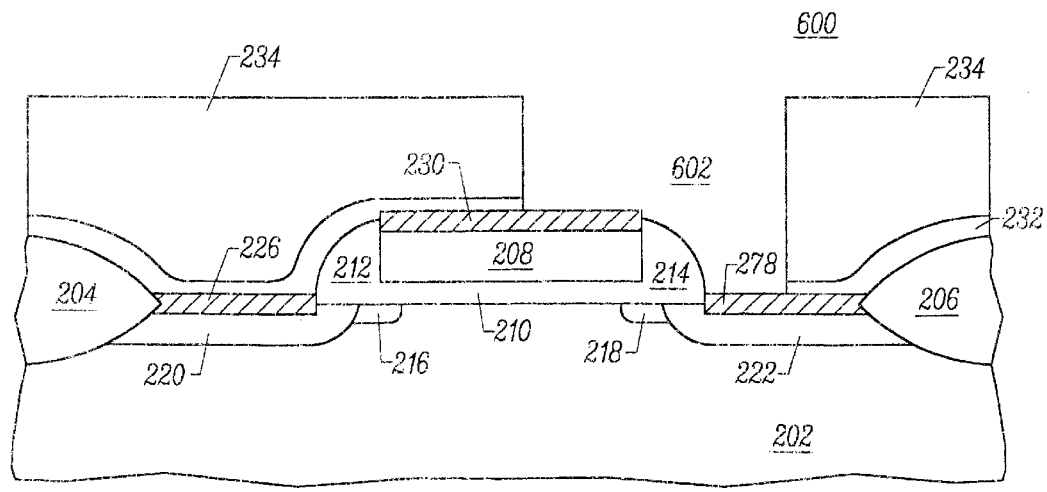
FIG. 6 is a depiction of the semiconductor device of FIG. 5, wherein an area of photoresist has been removed to expose underlying structures prior to manufacture of a local interconnect.
Figure 7:
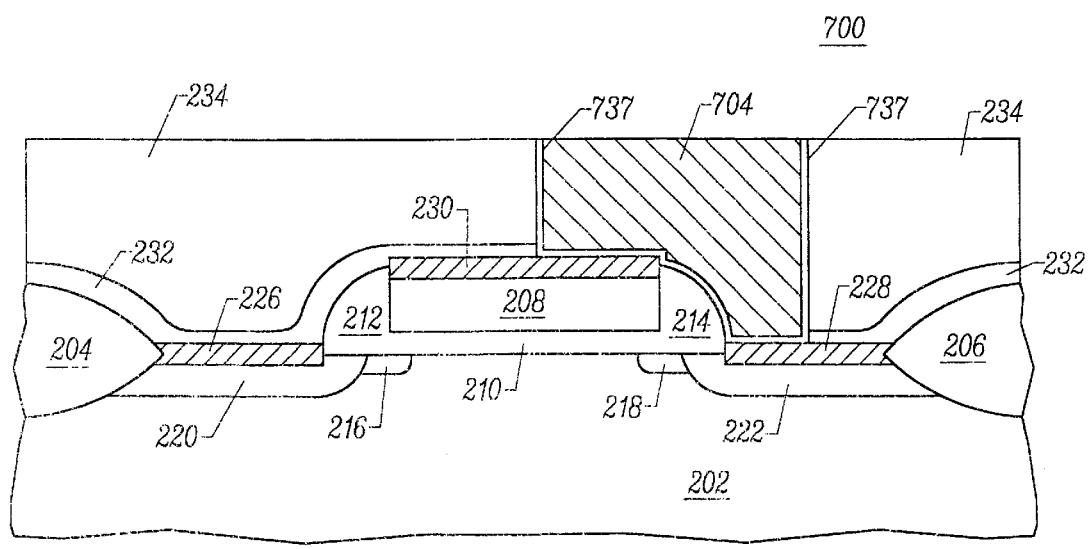
FIG. 7 is a depiction of the semiconductor device shown in FIGS. 4 and 5, wherein a local interconnect has been manufactured.

Another embodiment of this invention which has a local interconnect is shown in FIGS. 5–7. FIG. 5 shows a nonvolatile memory cell similar to that shown in FIG. 2. Like elements are given the same numbers as in FIG. 2. A semiconductor device 500 is manufactured on a semiconductor substrate 202 with the field oxide regions 204 and 206. The field oxide regions 204 and 206 regions are formed by locally oxidizing silicon (LOCOS) methods known in the art and will not be discussed further. Alternatively, electrical isolation can also be achieved by forming shallow trench isolation regions. The semiconductor device 500 has a gate 208, typically a polysilicon gate, separated from the semiconductor substrate by a gate oxide layer 210 with the sidewall spacers 212 and 214 formed on each side of the floating gate 208. The lightly doped drain (LDD) regions 216 and 218 are formed in the semiconductor substrate 202. The LDD regions 216 and 218 are typically formed by masking regions of the device 500 and implanting selected ions into the substrate 202. The formation of the LDD regions is typically done before the formation of the sidewall spacers 212 and 214. Ions that can be used to form LDD regions are phosphorous ions at a concentration of about $10^{13}$ ions per $cm^2$. The methods of implanting ions are well know in the semiconductor manufacturing art and will not be discussed further.

A source region 220 and a drain region 222 are thereafter formed in the semiconductor substrate 202. The formation of these regions is typically done by ion implantation of appropriate ions and is well known in the semiconductor manufacturing art and will not be discussed. The concentration of ions in the source and drain regions 220 and 222 is greater than the concentration of the ions in the LDD regions 216 and 218, and thus, the functions of the LDD regions 216 and 218 are subsumed by the source and drain regions 220 and 222. Ions that are typically implanted into the source and drain regions 216 and 218 are arsenic ions at a concentration of about $10^{15}$ ions per $cm^2$. It should be appreciated that other ions can be used to form either the LDD regions or the source and drain regions.

A source silicide layer 226 is formed on the source region 220, a drain silicide layer 228 is formed on the drain region 222, and a gate silicide layer is formed on the gate 230. A barrier or etch stop layer 232 is formed on the entire semiconductor device 500. Silicide layers are typically titanium silicide, $TiSi_2$, or cobalt silicide, $CoSi_2$, and are formed by methods well known in the semiconductor manufacturing art and will not be discussed further.

The barrier or etch stop layer 232 is formed by a high temperature (480° C. or higher) plasma CVD process which deposits a film of silicon nitride or silicon oxynitride or, alternatively, by an LPCVD process which deposits a silicon nitride film. The barrier or etch stop layer 232 is used to protect underlying features of the semiconductor device 500 from the typical etch materials used to etch silicon dioxide.

After deposition of the barrier or etch stop layer 232, the device is then exposed to the high temperature anneal process of this invention.

After annealing, the device 500 is coated with a dielectric material 234 formed on the semiconductor device 500. The dielectric material 234 electrically insulates the underlying portions of the device 500 from other elements that may be manufactured above the dielectric layer 234. It is important that the high temperature annealing process be carried out before a cap layer of $SiO_2$ dielectric is deposited on the device. A cap layer effectively traps free hydrogen, preventing its escape during subsequent processing steps. Therefore, for each layer of device structure, a separate anneal step must be performed to take advantage of decreasing the free hydrogen of the etch stop layer. The dielectric layer is planarized using chemical mechanical planarization, typically done by chemical mechanical polishing (CMP).

FIGS. 6 and 7 show the formation of a local interconnect by subsequent processing of the semiconductor device 600. Like numerical designations are used in FIGS. 6 and 7 for like elements as shown in FIGS. 2–5. In FIG. 6, after depositing the dielectric 234, the wafer is etched to create a channel 602 through the dielectric 234, exposing the drain silicide layer 228 sidewall 214 and the gate silicide layer 230. The channel 602 allows electrical contact between selected portions of the underlying device 600 and other portions of the same layer of device 600, such as the polysilicon gate silicide layer and the gate 208, or other selected portions of any device manufactured above the dielectric layer of the device 600.

FIG. 7 shows the subsequent formation of a local interconnect in the semiconductor device 700. An adhesive layer 737 is deposited in the channel 602. The adhesive layer 737 is made of Ti, TiN, or any other conventional adhesive material known in the art. Subsequently, a tungsten plug 704 is then deposited using conventional CVD approaches to make an electrical connection between the drain silicide layer 228, other portions of the same layer of the device 700, including the polysilicon gate silicide layer 230, or any other device manufactured above the dielectric layer 234. After tungsten deposition, the surface of the wafer is polished using conventional methods, resulting in a tungsten plug contact.

For applications to aluminum metal lines, the high temperature anneal step should be carried out before placing the metal on the substrate ("metalization"). The annealing process of this invention is ideally suited for any embodiments in which the metal is not melted during the heating step. Such metals include, but are not limited to tungsten and copper. In these latter applications, anneal steps may be performed after metalization without adversely affecting the metal lines. Furthermore, in devices using metals which do not melt at the 750° C. temperatures, the annealing step may be performed numerous times during fabrication of wafers, and both before or after chemical mechanical polishing of intermediate layers of the wafer.

EXAMPLES

Figure 8:
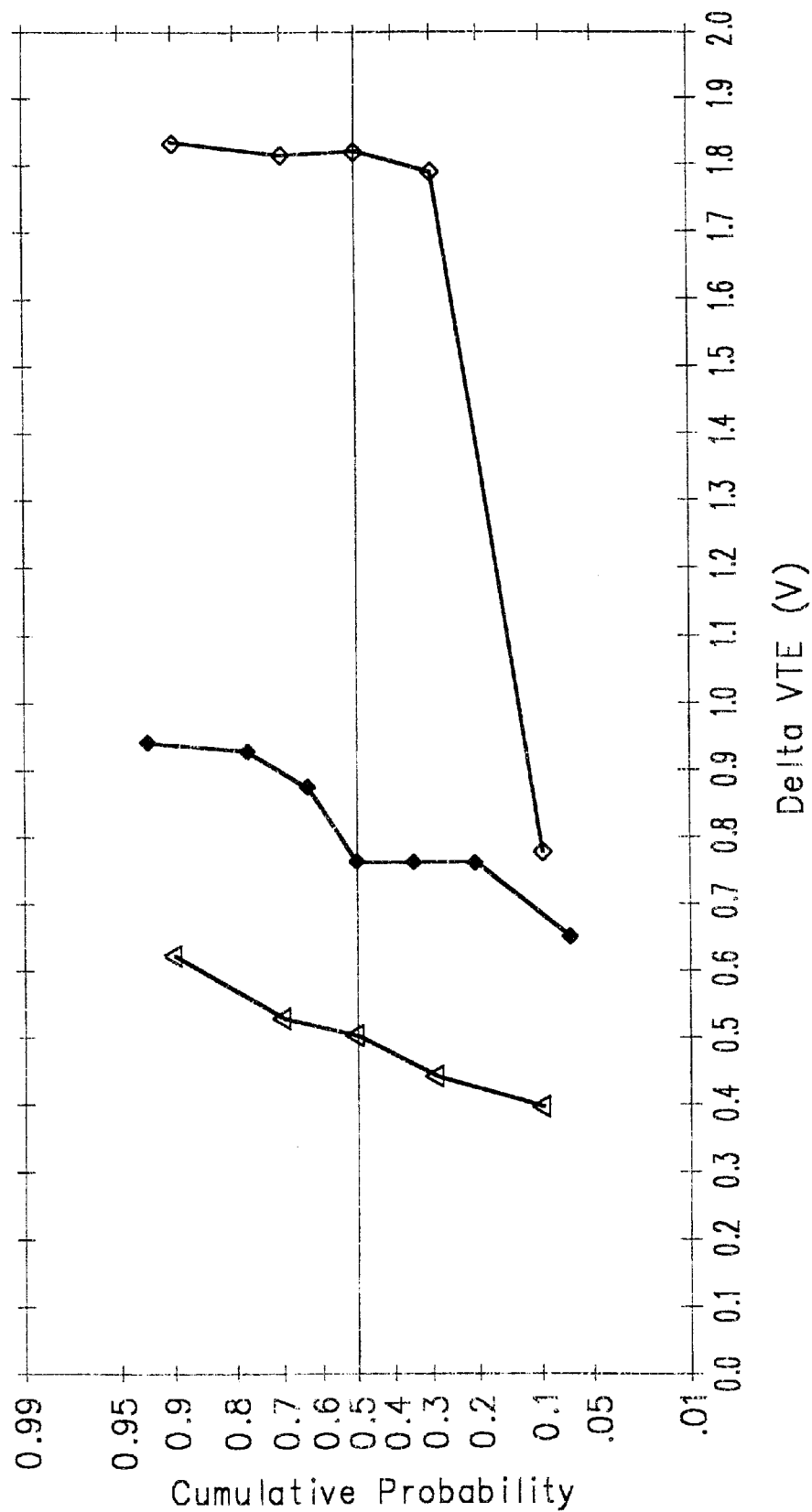
FIG. 8 shows the results of testing semiconductor devices of this invention manufactured without a phosphorous doped floating gate protect layer.

Example 1
Effect of High Temperature Annealing On Temperature Stability of Semiconductor Devices To determine the effects of high temperature annealing on the temperature sensitivity of devices, after their manufacture, devices were subjected to high temperature baking (69 hours at 250° C.), and their change in voltage (ΔVTE) was measured and was compared to the devices not subjected to the high temperature baking. The typical requirement is for a voltage drop of less than 0.1 V over 24 hours. However, the present devices were subjected to the more stringent conditions of baking for 69 hours. Devices made with an annealing step of this invention show remarkable high temperature stability. FIG. 8 shows the ΔVTE of non-volatile memory cells (EE8 devices lot # C642720 with an un-doped floating gate protect layer 350 Å thick after 69 hours at 250° C. The ΔVTE for each device is shown, and plotted as the cumulative probability for the distribution of the data. A cumulative probability of 0.5 represents the mean value of ΔVTE. The $E^2$ memory cells devices with conventional silicon oxynitride etch stop layers (◇) show unacceptably large voltage drops, with a mean drop in VTE of 1.8 V. Similarly, devices incorporating other etch shop layers, including oxynitride processed with a rapid thermal anneal (RTA) and oxynitride with furnace annealing show unacceptably large voltage drops of about 0.8 V (◆) and about 0.5 V (△), respectively. Even without the use of getter layers, FIG. 8 shows that furnace annealing significantly reduces the charge loss.

Figure 9:
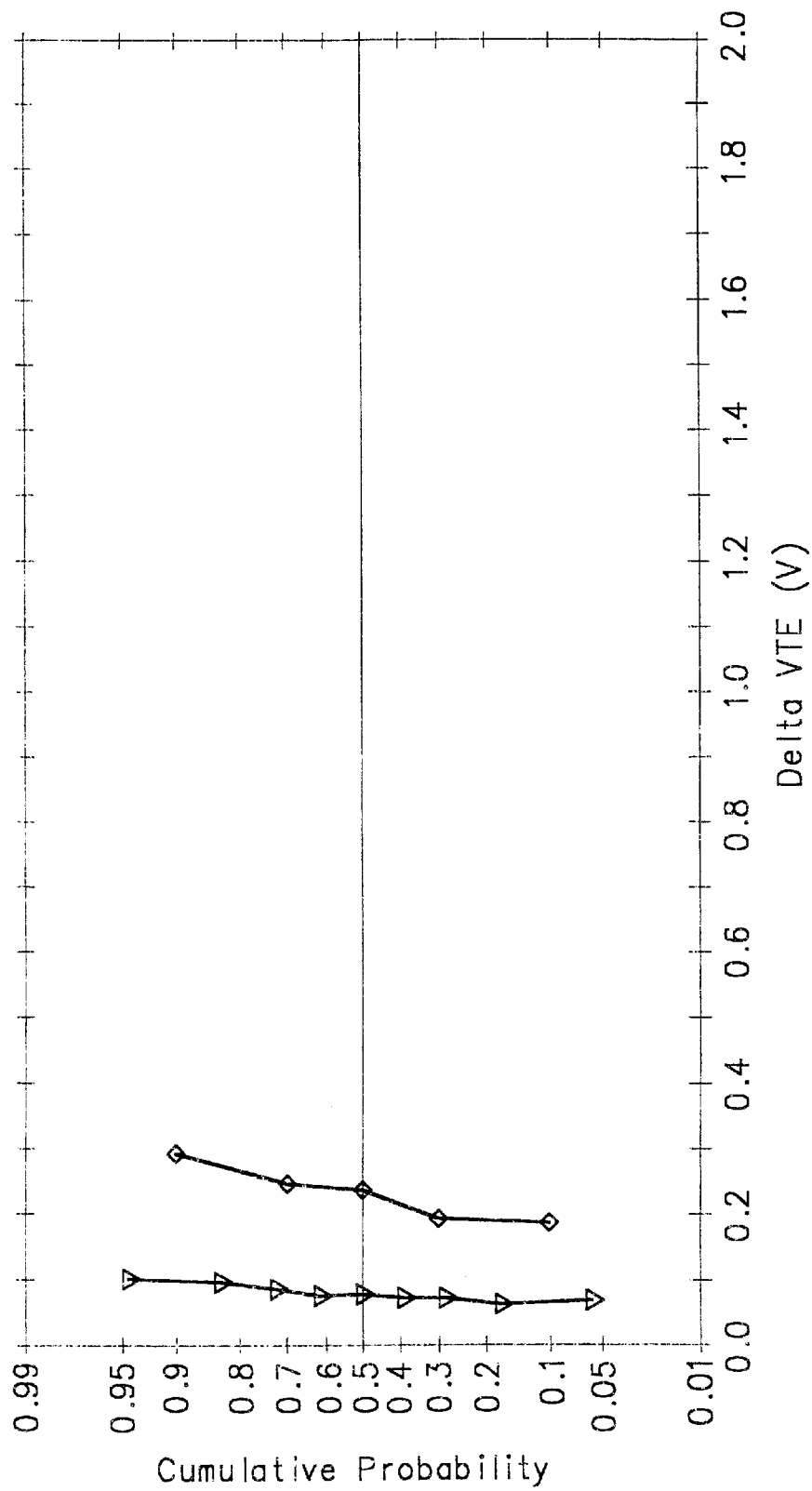
FIG. 9 shows the results of testing semiconductor devices of the this invention manufactured with a phosphorous doped floating gate protect layer.

FIG. 9 shows similar plots of ΔVTE for devices from the same lot as shown in FIG. 8, but with phosphorous-doped FGP layers, and the cumulative probability for the distribution is shown. A cumulative probability of 0.5 represents the mean value of ΔVTE for the tested devices. The $E^2$ memory cells with phosphorous-doped FGP layers showed much lower voltage drops than the devices with the un-doped FGP layer (FIG. 8). Even without annealing, the ΔVTE of the unannealed oxynitride was about 0.25 V (◇). This is less than that observed of the devices with un-doped FGP layer, but is still unacceptably high. In contrast, annealing the oxynitride on the same devices at high temperatures of this invention decreased ΔVTE to acceptable levels of about 0.1 V over the 69 h bake at 250° C. (△). These results are comparable to those obtained for conventional devices manufactured with no etch stop or barrier layer at all.

The above embodiments are for illustration only, and are not intended to limit the scope of the invention.

The many features and advantages of the present invention will become apparent to those of skill in the art through understanding of the disclosure, examples, figures, and claims, and modifications of the methods and devices are within the scope of the invention. All references mentioned herein are incorporated fully by reference.

INDUSTRIAL APPLICABILITY

This invention describes methods for manufacturing semiconductor devices with low free hydrogen etch stop or barrier layers with or without inclusion of hydrogen getter layers. The method involves annealing the semiconductor device to temperatures in the range of about 725° C. to about 775° C. The invention also describes semiconductor devices made from processes resulting in low free hydrogen.

We claim:

1. A method for manufacturing a semiconductor device on a semiconductor substrate, comprising:
   (a) forming, at a first temperature, one of an etch stop layer or a barrier layer overlying the semiconductor substrate;
   (b) annealing the layer formed in said step (a) at a second temperature higher than the first temperature to reduce the amount of free hydrogen in said layer; and
   (c) forming a cap layer overlying the layer formed in said steps (a) and (b) so that free hydrogen remains reduced in the layer formed in step (b).

2. The method of claim 1 wherein the step of forming one of the barrier layer and the etch stop layer further comprises forming a film selected from the group consisting of a high temperature PECVD nitride film, a high temperature PECVD oxynitride film and a high temperature LPCVD nitride film.

3. The method of claim 1 further comprising forming a hydrogen getter layer between the semiconductor device and at least one of the etch stop layer and the barrier layer.

4. The method of claim 3, wherein forming the hydrogen getter layer comprises forming a P-doped film.

5. The method of claim 4, wherein forming the P-doped film comprises forming a P-doped film having a thickness in the range of about 500 Å to about 2000 Å.

6. The method of claim 4, wherein the P-doped film is selected from the group consisting of a PSG film, a BPSG film, a PTEOS deposited oxide film, and a BPTEOS deposited film.

7. The method of claim 1, further comprising forming a channel in the cap layer exposing a portion of at least one element of the semiconductor device.

8. The method of claim 7, further comprising forming an adhesion layer in the channel in the cap layer.

9. The method of claim 8, further comprising filling the channel with a conductor.

10. The method of claim 9, wherein the conductor is a metal.

11. The method of claim 10, wherein the metal is selected from the group of tungsten and copper.

12. The method of claim 1, wherein multiple layers of at least an etch stop layer and a barrier layer are applied.

13. The method of claim 1, wherein the annealing step comprises heating in a furnace.

14. The method of claim 1, wherein the annealing step comprises heating with a rapid thermal process.

15. The method of claim 1, wherein the annealing step comprises heating in a substantial vacuum.

16. The method of claim 1, wherein the annealing step is at a temperature above about 500° C.

17. The method of claim 1, wherein the annealing step is at a temperature in the range of about 725° C. to about 775° C.

18. The method of claim 1, wherein the device has a thermal stability coefficient ($\Delta VTE$) of less than 0.1 V over 24 h at 250° C.

19. The method of claim 1, wherein at least one of the etch stop layer and the barrier layer has low residual stress.

20. The method of claim 1, further comprising forming an electrical connection by:
   forming a channel in at least one of the etch stop layer or the barrier layer,
   exposing at least one underlying element,
   forming an adhesive layer in the channel, and
   forming a metal plug in the channel in electrical contact with at least the one underlying element.

21. The method of claim 1, further comprising forming a local interconnect by:
   forming a channel in at least one of the etch stop layer or barrier layer, the channel exposing at least two underlying elements;
   forming an adhesive layer in the channel; and
   forming a metal plug in the channel in electrical contact with at least two of the underlying elements.

22. A method for manufacturing a barrier layer or an etch stop layer for a semiconductor device on a semiconductor substrate, comprising:
   (a) forming, at a first temperature, a nitride layer or an oxynitride layer overlying said substrate;
   (b) annealing the nitride layer or oxynitride layer formed in said step (a) at a second temperature higher than the first temperature to reduce the amount of free hydrogen in said layer; and
   (c) forming a cap layer overlying the nitride layer or the oxynitride layer formed in said steps (a) and (b) so that free hydrogen remains reduced in the layer formed in step (b).

23. A method for manufacturing a barrier layer or an etch stop layer for a semiconductor device on a semiconductor substrate, comprising:
   (a) forming, at a first temperature, a layer of a material selected from the group consisting of a high temperature PECVD nitride, a high temperature PECVD oxynitride and a high temperature LPCVD nitride;
   (b) annealing the layer formed in said step (a) at a second temperature higher than the first temperature to reduce the amount of free hydrogen in said layer; and
   (c) forming a cap layer overlying the layer formed in said steps (a) and (b) so that free hydrogen remains reduced in the layer formed in step (b).

24. A method for manufacturing a barrier layer or an etch stop layer for a semiconductor device on a semiconductor substrate, comprising:
   (a) forming, at a temperature of about 480° C., a layer of a material selected from the group consisting of a high temperature PECVD nitride, a high temperature PECVD oxynitride and a high temperature LPCVD nitride;
   (b) annealing the layer formed in said step (a) at a temperature of about 500° C. to reduce the amount of free hydrogen in said layer; and
   (c) forming a cap layer overlying the layer formed in said steps (a) and (b) so that free hydrogen remains reduced in the layer formed in step (b).

25. A method for manufacturing a barrier layer or an etch stop layer for a semiconductor device on a semiconductor substrate, comprising:
   (a) forming, at a first temperature, a layer of a material selected from the group consisting of a high temperature PECVD nitride, a high temperature PECVD oxynitride and a high temperature LPCVD nitride;
   (b) annealing the layer formed in step (a) at a second temperature higher than the first temperature, in a substantial vacuum to reduce the amount of free hydrogen in said layer; and
   (c) forming a cap layer comprising a dielectric material overlying the layer formed in said steps (a) and (b) so that free hydrogen remains reduced in the layer formed in step (b).

26. A method for manufacturing a semiconductor device, comprising:
   (a) forming a region of gate oxide on a semiconductor substrate;
   (b) forming a gate on the gate oxide;
   (c) forming sidewall spacers on each side of the gate;
   (d) forming a layer of material selected from the group consisting of a PSG film, a BPSG film, a PTEOS deposited oxide film, and a BPTEOS deposited film over said gate;
   (e) forming, at a temperature of about 480° C., a layer of material selected from the group consisting of a high temperature PECVD nitride film, a high temperature PECVD oxynitride film and a high temperature LPCVD nitride film after step (d);
   (f) annealing the layer formed in step (e) in a substantial vacuum and at a temperature in the range of about 725° C. to about 775° C. to reduce the amount of free hydrogen in said layer;
   (g) forming a cap layer comprising a dielectric material overlying the layer formed in said steps (e) and (f) so that free hydrogen remains reduced in the layer formed in step
   (h) forming a channel in the cap layer formed in step (g) exposing a portion of at least one element of the semiconductor device;
   (i) forming an adhesion layer in the channel formed in step (h); and
   (j) filling said channel with a metal selected from the group of tungsten and copper after step (i).

27. The method of claim 1, wherein said cap layer comprises dielectric material.

28. A method for manufacturing a semiconductor device on a semiconductor substrate, comprising:
   (a) forming a hydrogen getter layer overlying the semiconductor substrate;
   (b) forming, at a first temperature, one of an etch stop layer or a barrier layer overlying the layer formed in step (a);
   (c) annealing the layer formed in said step (b) at a second temperature higher than the first temperature to reduce the amount of free hydrogen in said layer; and
   (d) forming a cap layer overlying the layer formed in said steps (b) and (c) so that free hydrogen remains reduced in the layer formed in step (c).

29. The method of claim 28, wherein forming the hydrogen getter layer comprises forming a P-doped film.

30. The method of claim 27, wherein the P-doped film has a thickness in the range of about 500 Å to about 2000 Å.

31. The method of claim 27, wherein the P-doped film is selected from the group consisting of a PSG film, a BPSG film, a PTEOS deposited oxide film, and a BPTEOS deposited film.

* * * * *